US 6,566,017 B1

(12) United States Patent
Chen et al.

(10) Patent No.: US 6,566,017 B1
(45) Date of Patent: May 20, 2003

(54) SEMICONDUCTOR WAFER IMAGING MASK HAVING UNIFORM PATTERN FEATURES AND METHOD OF MAKING SAME

(75) Inventors: Jeng-Horng Chen, Hsin-Chu (TW); Shi-Jay Lin, Taipei County (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 166 days.

(21) Appl. No.: 09/638,488

(22) Filed: Aug. 14, 2000

(51) Int. Cl.$^7$ .............................. G03F 9/00; G03C 5/00
(52) U.S. Cl. ............................ 430/5; 430/296; 430/30
(58) Field of Search ............................... 430/5, 22, 30, 430/296

(56) References Cited

U.S. PATENT DOCUMENTS 6,001,512 A * 12/1999 Tzu et al. ..................... 430/5

FOREIGN PATENT DOCUMENTS

JP 08220732 * 8/1996

* cited by examiner

Primary Examiner—John A. McPherson
Assistant Examiner—Saleha R. Mohamedulla
(74) Attorney, Agent, or Firm—Tung & Associates

(57) ABSTRACT

A mask used to image circuit patterns onto a semiconductor wafer exhibits improved uniformity of critical feature dimensions. A pattern of dummy features is formed around the outer periphery of the main pattern field during manufacture of the mask. The presence of the dummy field eliminates loading of the etch rate at the marginal areas of the main pattern field, thereby assuring that all of the features in the main pattern field are etched at substantially the same rate. The dummy field pattern is covered by an opaque layer of material after etching of the mask in order to prevent the dummy features from being imaged onto the wafer.

10 Claims, 1 Drawing Sheet

SEMICONDUCTOR WAFER IMAGING MASK HAVING UNIFORM PATTERN FEATURES AND METHOD OF MAKING SAME

TECHNICAL FIELD

The present invention generally relates to semiconductor manufacturing processes employing photolithography and etching processes to form circuit patterns on a semiconductor wafer, and deals more particularly with an improved mask used to image circuit patterns onto the wafer to achieve uniform features across the entire field of the imaged pattern.

BACKGROUND OF THE INVENTION

Well known photolithography processes for forming circuit patterns on semiconductor wafers to produce integrated circuits typically employ a mask for imaging complex circuit patterns onto the wafer. The subsequent semiconductor processes used to form integrated circuits (IC's) typically include chemical and physical film depositions, etching, ion implantation, defusion, annealing or thermal oxidation. Many of these processes require that a pattern of photoresist first be formed on the wafer substrate. The technique for patterning the photoresist is referred to as a photolithography process, which involves first depositing a uniform layer of photoresist onto the substrate, next exposing the photoresist layer to optical or illumination through the mask, and then developing the exposed photoresist layer. The patterned photoresist layer that results from this process corresponds to the pattern on the mask. Depending upon the type of photoresist used, the image is either a positive one or a negative one.

A conventional mask used in a so-called step-and-repeat or "stepper" machine, consists of a thin layer of chromium (typically 500 nm) deposited and then patterned on a flat glass or quartz substrate. During the photolithography process, the masked pattern is reduced by a certain factor, for example by a factor of five after it is transferred onto the substrate by a lithographic exposure system forming part of the stepper. This pattern is typically binary i.e. it is either opaque or transparent. In a conventional optical lithography system, the image resolution and the depth of the focus are determined by the wavelength of the illumination light and the numeric aperture of the optics, and not by the mask itself.

Over the last decade, innovations in photolithography have been directed toward improving resolution and alignment accuracy, increasing throughput and reducing defects. As integrated circuit technology advances, the number of layers in an IC has increased, and as a result, the number of photolithographic processes required to fabricate an IC has also increased.

A number of factors have an influence on design limits, circuit performance and defect rate. The minimum image size that can be printed on the surface of a substrate with a specified "fidelity" depends primarily on the resolution of the photographic apparatus and resist properties. Other factors, however, such as process-induced fluctuations in pattern dimensions, device reliability and circuit performance play important roles in determining design guidelines. These factors sometimes restrict the patterns to dimensions that are not at the "photolithographic limit". For example, etching, oxidation and lateral diffusion of dopants can cause the final wafer dimensions to deviate considerably from those defined in a resist; reliability concerns, such as electromigration in metals, may limit the metal width or contact size to dimensions larger than the minimum feature size. Dimensions that must be rigorously controlled during mask inspection and after imaging on the resist to ensure that circuits operated within specifications are called critical dimensions (CD). The imaging process, as well as other factors can cause the average line width that is measured in the resist to be larger or smaller than on the mask. This difference is sometimes referred to as the "bias". Fluctuations in the imaging process cause variations in the resist dimensions. These latter mentioned variations are referred to as tolerances. To some degree, these variations may be taken into consideration when designing the layout of the circuit pattern.

However, not all process variations can be compensated for by adjustments in the design layout of the circuit pattern. One such process that materially affects CD's is that of etching of the exposed layer of photoresist. In typical plasma reactors, the etch rate is proportional to the concentration of reactive species which, on average, is determined by the difference of the rates of generation and loss of species. In typical plasma reactors, the main loss mechanism of etchants is their consumption by reaction with the material being etched. Therefore, more reactive neutrals are depleted as the etchable surface area is increased. Since the generation of reactive species is independent of the amount of etchable material present, there is a net loss of reactive species which increases as more etchable substrate is exposed. The result is a decrease in the etch rate as the exposed surface area is increased, a phenomena referred to as "loading effect". Well known formulas defining the relationship between the etch rates and other variables show that there is negligible loading when the exposed area being etched is very small and/or the lifetime of the active species in the absence of etchable material is small. Therefore, loading defects can be reduced by employing plasmas in which the dominant etch loss mechanism is insensitive to the consumption by reaction.

The most serious concern caused by the loading effect is the loss of etchant control when nearing the "end point" of an etching process, i.e. when a desired amount of photoresist has been removed. Ideally, as the termination of an etch process is approached, the etch rate should decrease to allow stopping the process at the correct time and minimizing over-etching. With the loading effect, however, the etchable material is exposed during the end point and the etch rate increases rapidly, so that over-etching is carried out at a higher rate than nominal. This makes line width control extremely difficult, since accelerated etching occurs on clearing.

A microscopic loading effect, in which the etch rate is influenced by the size and density of features, is referred to as microloading. This is the consequence of localized concentrations of gradients of etchant species, which are caused by differing rates of reaction with the patterned surface. For feature sizes below about one micron, and an aspect ratio much greater than one, etching rates are observed to depend on pattern density and aspect ratio. The term "microloading" is commonly used in the art to describe its dependence of etch rate on the exposed etchable defined by the pattern.

Loading effect can be either global or localized. Global loading effect is dependent upon the total amount of photoresist being etched. However, localized loading effect is effected by the localized density of circuit features, the relative positions of features and the type of materials being etched, where multiple materials are being etched. In connection with semiconductor manufacturing processes for producing conventional integrated circuits, it has been observed that the etch rate of photoresist defining circuit features along the outer periphery of the imaged pattern, and thus of the mask, tend to etch at a higher rate than the main body or the central area of the wafer. This higher etch rate along the marginal areas of the overall pattern is due to the loading effect caused by the absence of etchable materials immediately outside the borders of the imaged pattern. In other words, circuit features are present up to and sometimes contiguous with the outside borders of the overall imaged pattern, but etchable material is not present outside the border. As the result, there is less overall etchable material around those circuit features being etched at the marginal area of the field, thus causing them to etch at a higher rate. This loading effect along the outer border of the imaged field results in critical dimensions of circuit features along the border which are lesser in quality than those in the main, central field of the image.

The present invention is directed towards achieving overall uniformity of CD's across the entire area of the imaged pattern.

SUMMARY OF THE INVENTION

According to one aspect of the present invention, a method is provided for forming a semiconductor wafer exposure mask having improved pattern uniformity, comprising the steps of forming a main field pattern in a main field on the mask; forming a dummy field pattern in a dummy field area outside of and adjacent to the outer edges of the main field; and, covering the dummy field pattern with a layer of opaque material to prevent the dummy field pattern from being imaged onto the wafer during exposure of the wafer using the mask. The main field and dummy field are preferably formed substantially simultaneously. The method also includes determining the width of the dummy field pattern required to achieve substantially uniform etch rates during etching of the mask. It is also preferable to select a pattern density for the dummy field pattern that is substantially equal to the pattern density of the main field pattern. The dummy field pattern is covered on the mask by depositing an opaque film of material, such as carbon over the dummy pattern on the mask.

According to another aspect of the invention, a mask is provided for use in imaging a pattern onto a semiconductor wafer during a photolithography process. The mask includes a transparent plate, a main field pattern formed on a central area of the plate, a dummy field pattern formed on the plate along the periphery of the main field and an opaque layer of material formed over the dummy layer which blocks the transmission of light, whereby to prevent the dummy features being imaged onto the wafer. The dummy field pattern preferably extends around the entire periphery of the main field pattern, and is defined by a strip of features of substantiality uniform density. The opaque layer of material is preferably selected from the group consisting of carbon, resin and metal. The size of the dummy pattern is generally between 20% and 30% of the size of the main field pattern.

Accordingly, it is the primary object of the present invention to provide a method of forming circuit patterns on a semiconductor wafer having uniform, critical feature dimensions over the entire field of pattern imaged onto the wafer.

Another object of the invention is to provide a method as described above which eliminates loading effect of the etch rate of circuit features along the outer periphery of the circuit pattern formed on the mask.

Another object of the invention is to provide a method as mentioned above which eliminates the etch loading effect through a simple modification of the imaging mask.

A further object of the present invention is to provide a method as described above which can be carried out using conventional manufacturing techniques.

These, and further objects and advantages of the present invention will be made clear or will become apparent during the course of the following description of a preferred embodiment of the invention.

BRIEF DESCRIPTION OF THE DRAWINGS

In the drawings which form an integral part of the specification and are to be read in conjunction therewith, and in which like reference numerals are employed to designate identical components in the various views.

FIG. 1 is a plan view of a prior art mask used to image circuit patterns into a semiconductor wafer;

DESCRIPTION OF THE PREFERRED EMBODIMENT

Figure 1:
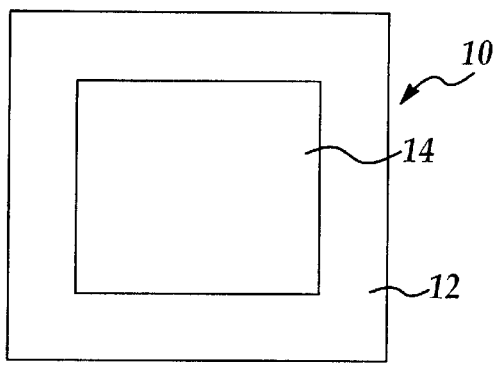
FIG. 1 is a plan view of a typical, prior art imaging mask used in a photolithography process to image circuit patterns onto semiconductor wafers.

Referring first to FIG. 1, a conventional imaging mask generally indicated by the numeral 10, is used in a well-known step and repeat apparatus for imaging circuit patterns onto the surface of a substrate (not shown) such as a semiconductor wafer. The mask 10 may comprise a plate of transparent material such as glass or quartz, through which light may be transmitted from a laser or other source of illumination. One side of the mask 10 is covered by a layer of an etchable, opaque metal, such as chromium. The metallic layer has the desired circuit pattern formed in a main rectangular field 14, i.e. portions of the chromium layer in the main field 14 are etched away to define the desired circuit pattern which is to be imaged onto the wafer. The outer peripheral area 12 of chromium is not etched, and thus is completely opaque to light.

As discussed previously, critical dimensions of circuit features appearing in the main field 14 and formed on the substrate may not be uniform across the entire area of the main field 14. This lack of uniformity is the result of the tendency of the etch rate of the photoresist deposited on the transparent substrate during manufacture of the substrate to be higher at the outer periphery or marginal areas of thereof, compared with the central areas of the main field. This loading effect is a result of the fact that during etching of the exposed photoresist on the glass substrate, there are no circuit features or other materials present that are etched along the outer periphery of the main field, consequently the reactive species of the etchant increases relative to the main field since there is less etched material or neutrals along the periphery of the main filed 14 with which the reactive species may combine.

In accordance with the present invention, compensation is made for the reduced area of etchable material along the outer borders of the main field 14 by providing a rectangularly shaped strip 16 of circuit features 24 immediately outside of and continuous to the outer border 22 defining the main field 14.

Figure 2:
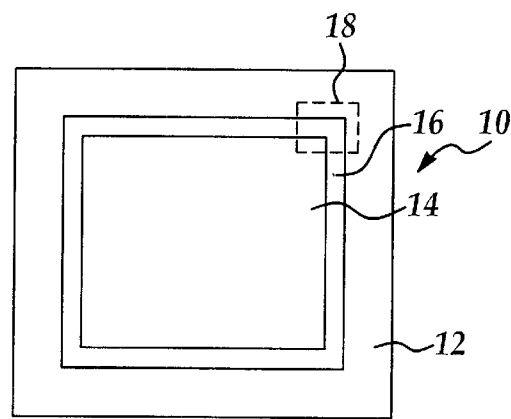
FIG. 2 is a view similar to FIG. 1, but showing modifications of the mask in accordance with the preferred embodiment of the present invention.
Figure 3:
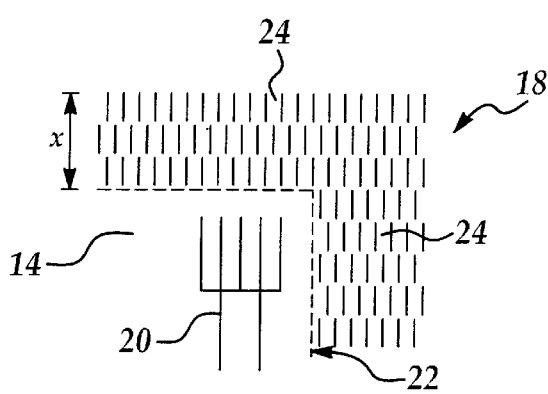
FIG. 3 is a greatly enlarged, fragmentary view of one section of the mask shown in FIG. 2, during an intermediate stage of processing.
Figure 4:
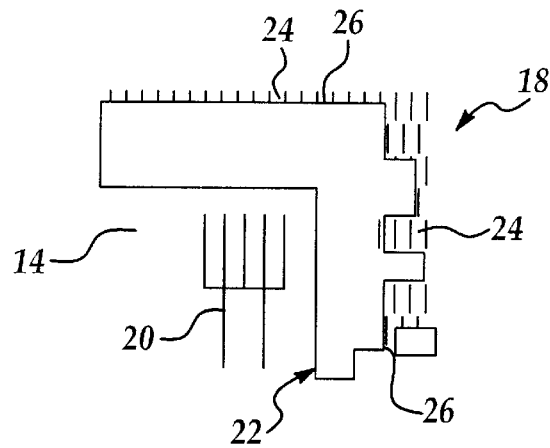
FIG. 4 is a view similar to FIG. 3 but showing the mask after the final stage of processing.

Referring to FIGS. 2–4, one portion of the corner 18 of the main field is shown in greater detail in FIGS. 3 and 4. The dummy field 16 possesses circuit-like features 24 that are specifically selected to achieve a desired density. The combination of the density of the circuit features 24 in the dummy pattern 16 and width "X" of the dummy field 16 are selected so as to typically to comprise between 20 and 30% of the total area of the main field 14. However this ratio will be dependent on a number of processing variables and the particular application. In one application, it has been found that the width X of the dummy field is preferably about five mm.

The circuit features 24 formed in the dummy pattern area 16 are produced using conventional mask making techniques which include depositing a layer of photoresist over the glass plate forming the mask 10 and then using an electron beam or other similar device to pattern the photoresist, following which the photoresist is etched away to form the remaining circuit patterns. Preferably, the main field 14 and the dummy field 16 are formed substantially simultaneously, in the same process step. After the main and dummy fields 14, 16 have been formed on the mask plate, as is shown in FIG. 3, the next step in forming the mask 10 comprises depositing a layer of opaque material 26 over at least those sections of the dummy area 16 which are contiguous to the outer border 22 and the main field 14. The opaque material layer 26 may be carbon, a resin or a metal. A layer of dark carbon film greater than 3000 angstroms thick has been found suitable for masking the dummy area 16. The purpose of the opaque layer 26 is to prevent any of the circuit features in the dummy pattern 16 from being imaged onto the wafer substrate.

From the foregoing, it is apparent that a method for making a semiconductor wafer exposure mask is provided comprising the steps of forming a main field pattern in a main field on the mask, forming a dummy field pattern in a dummy field area outside of and adjacent to the outer edges of the main filed, and covering the dummy field pattern with a layer of opaque material to prevent the dummy field pattern from being imaged onto the wafer during an exposure of the wafer using the mask.

As a result of the use of a dummy field 14, substantially uniform etch rates are achieved across the entire field 14, including the outer perimeter thereof during an etching process used in forming the circuit patterns 20 or the mask 10. Consequently, uniformity of critical dimensions is achieved over the entire field 14 of both the mask 10, and the field imaged onto the semiconductor wafer substrate.

From the foregoing, it is apparent that the present invention not only provides for the reliable accomplishment of the objects of the invention, but it does so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of making a semiconductor wafer exposure mask having improved pattern uniformity, comprising the steps of:

(a) forming a main field pattern in a main field on said mask;

(b) forming a dummy field pattern on said mask in a dummy field area outside of and adjacent to the outer edges of said main field, including selecting a pattern density for the dummy field such that when the mask is subjected to etching, the etch rate at the outer edges of said main field pattern is equal to the etch rate of other areas of said main field pattern; and (c) covering said dummy field pattern with a layer of opaque material to prevent said dummy field pattern from being imaged onto said wafer during an exposure of said wafer using said mask.

2. The method of claim 1, wherein steps (a) and (b) are performed simultaneously.

3. The method of claim 2, wherein steps (a) and (b) each include using an electron beam to form said main field pattern and said dummy pattern.

4. The method of claim 1, wherein step (b) is performed by forming said dummy field pattern completely around the outer edges of said main field pattern.

5. The method of claim 1, including the step of determining the width of said dummy field pattern along said outer edges of said main pattern required to achieve uniform etch rates during etching of said main field pattern and said dummy field pattern.

6. The method of claim 1, including the step of selecting a pattern density for the dummy field pattern that is equal to the pattern density of said main field pattern, such that the etch rate at said outer edges of said main field pattern is equal to the etch rate of other areas of said main field pattern.

7. The method of claim 1, wherein step (C) is performed by depositing a film of carbon on said dummy field pattern.

8. A method of making a mask used in a photolithography process to image a pattern of circuit features onto the surface of a semiconductor wafer, comprising the steps of:

(a) forming a main field pattern of circuit features on a mask plate, the circuit features imaged onto said plate along the outer periphery of said main field pattern ordinarily tending to etch at a faster rate during etching of said plate following exposure of said main field pattern onto a layer of photoresist on said plate, compared to the etch rate of circuit features imaged onto central areas of said plate;

(b) forming a dummy pattern of dummy features on said mask plate, the presence of said dummy features on said plate reducing loading of the rate of etching of a layer of exposed photoresist along the outer periphery of said main field pattern, said forming including selecting a pattern density for the dummy pattern such that when the mask is subjected to etching, the etch rate at the outer edges of said main field pattern is equal to the etch rate of other areas of said main field pattern; and (c) applying a layer of opaque material over said dummy pattern, said opaque layer preventing said dummy features from being imaged onto said wafer.

9. The method of claim 8, wherein steps (a) and (b) are performed simultaneously.

10. The method of claim 8, wherein step (b) is performed by forming said dummy features outside of and along the periphery of said main field pattern.

* * * * *